US006663736B1

(12) United States Patent
Ardini et al.

(10) Patent No.: US 6,663,736 B1
(45) Date of Patent: Dec. 16, 2003

(54) METHOD FOR MAKING A BONDED SAPPHIRE STRUCTURE

(75) Inventors: Edward A. Ardini, Billerica, MA (US); Anthony M. DeFeo, Nashua, NH (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 149 days.

(21) Appl. No.: 10/007,606

(22) Filed: Nov. 7, 2001

(51) Int. Cl.⁷ .......................... B32B 31/00; C04B 33/34
(52) U.S. Cl. .......................................... 156/153; 156/89
(58) Field of Search ............................ 156/89, 99, 153, 156/281

(56) References Cited

U.S. PATENT DOCUMENTS

| | | | | |
|---|---|---|---|---|
| 4,925,608 A | * | 5/1990 | Rossi et al. | 156/89.28 |
| 4,939,101 A | * | 7/1990 | Black et al. | 438/455 |
| 5,013,380 A | * | 5/1991 | Aoshima | 156/250 |
| 5,201,977 A | * | 4/1993 | Aoshima | 156/153 |
| 5,423,942 A | | 6/1995 | Robbins et al. | |
| 6,012,303 A | * | 1/2000 | Axelson et al. | 65/36 |
| 6,284,085 B1 | * | 9/2001 | Gwo | 156/273.7 |

OTHER PUBLICATIONS

"Silicon Processing for the VLSI Era", vol. 1, Second Edition, by authors Stanley Wolf and Richard Tauber, published by Lattice Press, copyright dated 2000, having ISBN No. 0–961671–6–1 Chapter 1 p. 2.

"Use of Sapphire Liners to Eliminate Edge Growth in LPE", Journal of Crystal Growth, by M.C. Tamargo and C.L. Reynolds, vol. 55, Issue 2, dated Nov. 1981.

* cited by examiner

Primary Examiner—Wael Fahmy
Assistant Examiner—William Vesperman (57) ABSTRACT

A method for making a single crystal structure. The method including selecting a plurality of single crystal components having a lattice unit cell repeated substantially throughout, the unit cell having a periodic arrangement of atoms defining a set of lattice planes. Determining the orientations of the lattice planes relative to each component. Machining each component along at least one of the set of lattice planes to define a pair of interface surfaces thereon. Applying bonding material to each interface surface. Assembling the components at their respective interface surfaces such that each pair of matching interface surfaces have an orientation substantially aligned along a common one of the set of lattice planes. Heating the components per a predetermined temperature profile until the bonding material melts and fuses the components together.

15 Claims, 7 Drawing Sheets

FIG. 13 ively scratch proof. It has a melting point of over 2000
METHOD FOR MAKING A BONDED SAPPHIRE STRUCTURE

CROSS-REFERENCE TO RELATED APPLICATIONS

The present application is related to co-pending application entitled, "Bonded Sapphire Polygon Shield", to Anthony M. DeFeo, Ser. No. 10/007,605 filed concurrently herewith and incorporated herein by reference.

FIELD OF THE INVENTION

The present invention relates to semiconductor manufacturing. More specifically, the present invention relates to a method of making bonded sapphire structures wherein the mating surfaces are aligned along like lattice planes.

BACKGROUND OF THE INVENTION

Sapphire is increasingly becoming the material of choice for engineers faced with the design challenges of extreme conditions, such as those found in high-temperature, high-pressure or harsh chemical environments. Its unique properties make it a cost-effective solution for those applications where long life and high performance are a must.

One of the hardest materials in existence, sapphire is virtually scratch proof. It has a melting point of over 2000 degrees C., making it ideal for high temperature applications. It is chemically inert and easily withstands harsh chemicals such as fluorine plasma (used extensively in the semiconductor industry) and other industrial gases and fluids, with no particle generation. In addition, sapphire can transmit ultraviolet, visible and infrared light, as well as microwaves, a range broader than most materials. Sapphire has been used in such diverse applications as providing shielding for the nose cones of a missiles which can transmit laser light information therethrough, or providing guide tubes, protective shields, or support structures for various processes used in the manufacturing of semiconductor devices.

Single crystal sapphire is usually grown in boules or ingots. Boules are generally pear shaped or cylindrical masses formed synthetically in a special furnace with the atomic structure of a single crystal. These boules can be sliced or machined to fit the shape of the required structure needed.

However, it is very difficult to grow sapphire boules that are larger than 2 to 3 inches in diameter. Additionally, the machining operations on the boules can be expensive. Therefore, prior art methods of producing large sapphire structures having overall dimensions in excess of these diameters are very difficult and expensive to make. Examples of such sapphire structures would be large hollow domes, polygons or spherical structures used as shielding in the semiconductor or military industries.

Additionally, prior art sapphire structures used in the production of silicon wafers must also be able to withstand high temperature processing of the wafers without damage. However, expansion and contraction during these high temperature operations will often cause trouble with bonding materials used to construct prior art sapphire structures. Even different prior art structural components composed entirely of single crystal sapphire will encounter problems with different coefficients of expansion along the different lattice planes of the crystal.

Based on the foregoing, it is the general object of the present invention to provide a method of making a sapphire structure that overcomes the problems and drawbacks associated with prior art contamination control structures.

SUMMARY OF THE INVENTION

The present invention offers advantages and alternatives over the prior art by providing in a first aspect a method for making a single crystal structure. The method including selecting a plurality of single crystal components having a lattice unit cell repeated substantially throughout, the unit cell having a periodic arrangement of atoms defining a set of lattice planes. Determining the orientations of the lattice planes relative to each component. Machining each component along at least one of the set of lattice planes to define a pair of interface surfaces thereon. Applying bonding material to each interface surface. Assembling the components at their respective interface surfaces such that each pair of matching interface surfaces have an orientation substantially aligned along a common one of the set of lattice planes. Heating the components per a predetermined temperature profile until the bonding material melts and fuses the components together.

In an alternative embodiment of the invention the method includes selecting a plurality of sapphire components. Additionally, the components can be either panels and/or structural members.

In another alternative embodiment the method includes applying a eutectic bonding material to the components.

DETAILED DESCRIPTION OF THE PREFERRED EMBODIMENTS

Figure 1:
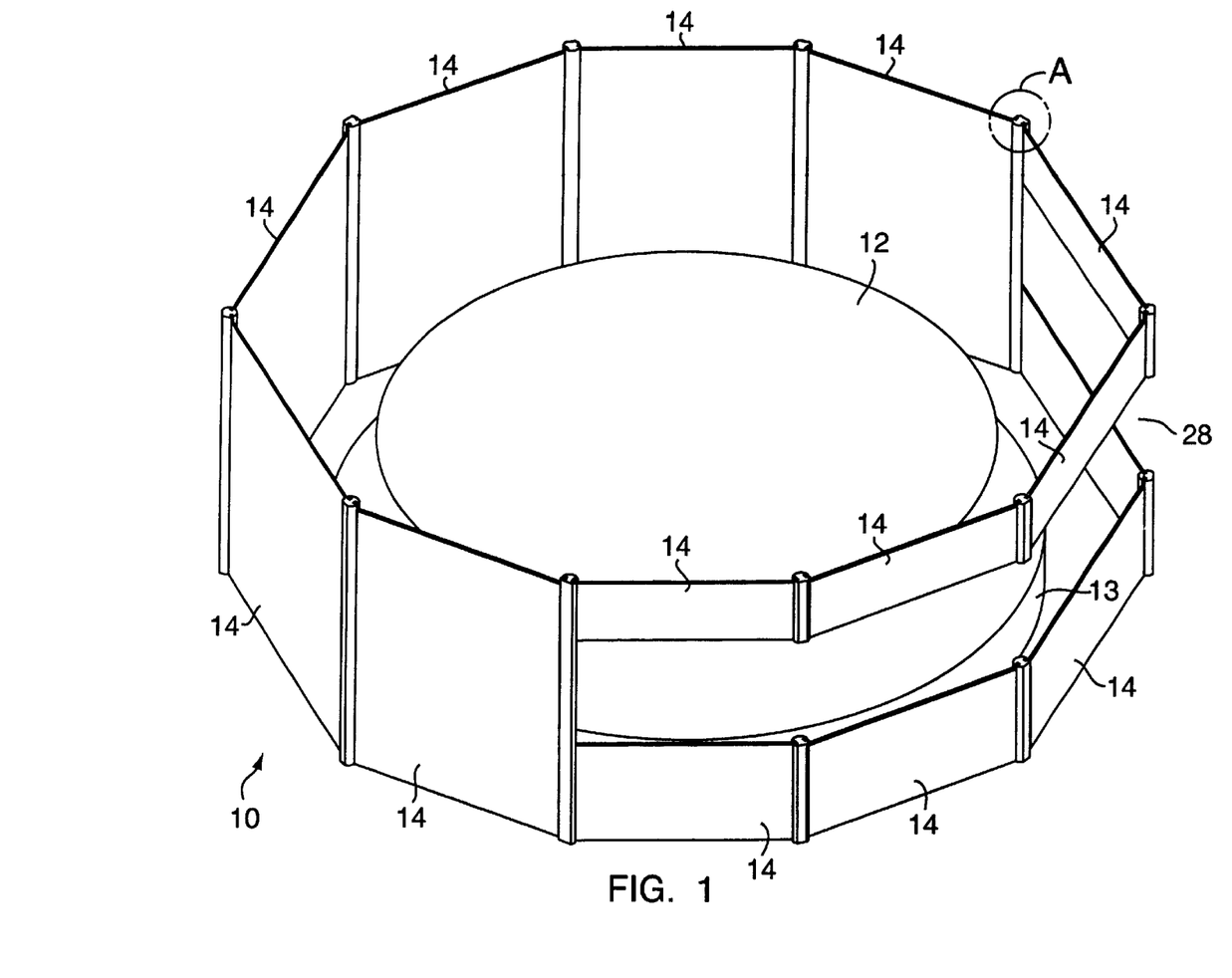
FIG. 1 is a perspective view of a sapphire shield in accordance with the present invention.
Figure 2:
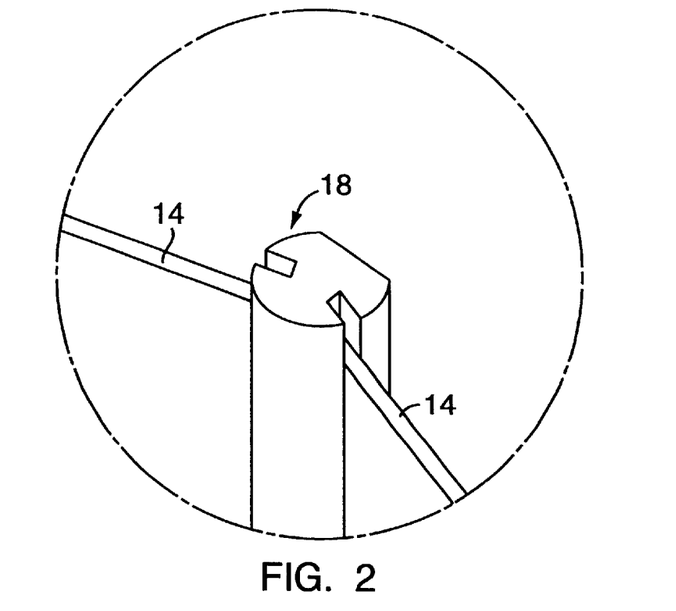
FIG. 2 is an expanded view of the circled area A of FIG. 1.
Figure 3:
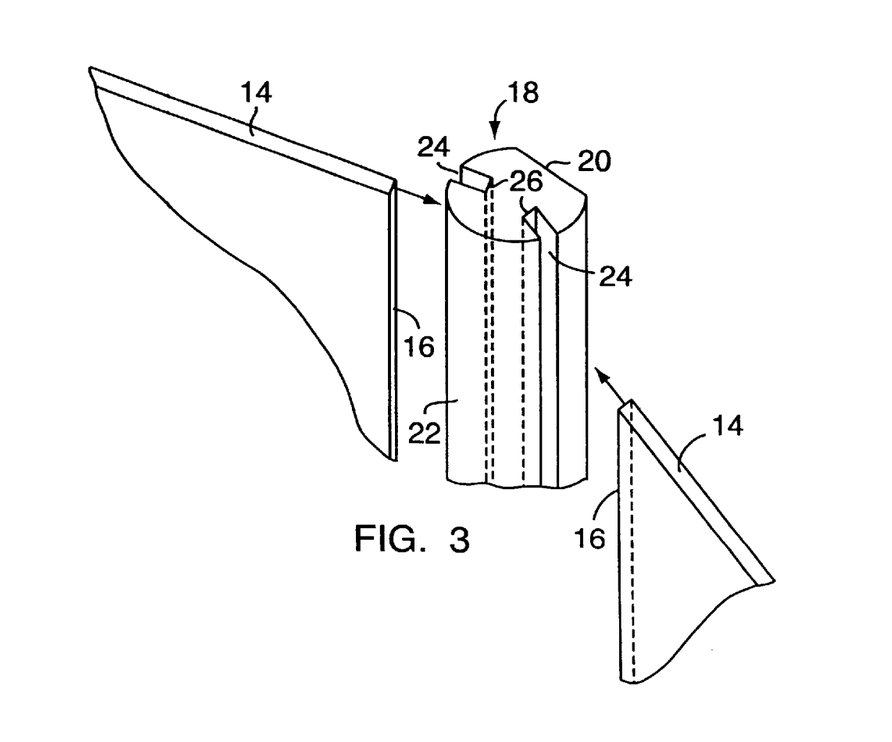
FIG. 3 is an expanded view of FIG. 2.

Referring to FIGS. 1, 2 and 3, and exemplary embodiment of a sapphire shield in accordance with the present invention is shown generally at 10. The sapphire shield 10 is used to protect silicon wafers 12 from contaminates generated during such processes as photoresist dry etching with fluorine plasma.

The sapphire shield 10 surrounds the silicon wafer 12, which is clamped in place by chuck 13, during such processes to contain the plasma therein and to prevent the plasma from reacting with chamber walls (not shown). The sapphire is utilized because it is chemically inert even under extreme conditions. It easily withstands harsh chemicals such as fluorine plasma and other industrial gases and fluids, with no particle generation. Also, the melting point of sapphire is over 2000 degrees C., making it ideal for high temperature applications.

The sapphire shield 10 includes a plurality of sapphire single crystal panels 14 each including a pair of first interface surfaces 16 (best seen in FIG. 3) located on opposing ends thereof. Though the panels 14 are shown as being generally flat other shaped panels may also be used, e.g., arcuate panels.

The shield 10 also includes a plurality of sapphire single crystal structural members 18. The structural members 18 are generally rod shaped with a flatly ground reference surface (or outer perimeter) 20 and an arcuate inner perimeter 22. A pair of vertically extending interface grooves 24 are located on opposing sides of the structural member 18 between the flat reference surface 20 and inner perimeter 22. The grooves 24 are machined at an angle relative to the reference surface 20 and sized to receive the end portion of the panels 14. The bottom inside surface 26 of each groove 24 provides a second interface surface 26 against which the first interface surface 16 engages. Though the structural members 18 are shown as being generally rod shaped, other shaped structural members may also be used, e.g., generally bar shaped.

Additionally, one skilled in the art would recognize that the second interface surfaces 26 do not have to be located at the bottom inside surface of a groove. For example, the inner perimeter 22 of the structural member 18 may be machined flush with the groove 24, i.e., one side of the groove can be removed, to leave a stepped surface as the second interface surface 26.

The panels 14 and structural members 18 are alternately bonded together at their respective first and second interface surfaces 16 and 26 to define an enclosed generally polygonal shaped area sized to receive the silicon wafers therein. Any compound used to bond the first 16 and second 26 interface surfaces together must have substantially equivalent coefficients of expansion and chemical compatibility as the sapphire panels 14 and structural members 18. Additionally, the compound or must have a melting point sufficiently high enough to withstand the same high temperature processes the shielding 10 will be subjected to. One such compound used in this case is a yttrium-containing eutectic bonding compound as described in detail in U.S. Pat. No. 6,012,303, which is herein incorporated by reference.

Additionally, as will be explained in greater detail hereinafter, the bonded first and second interface surfaces 16 and 26 must have orientations that are aligned along a like lattice plane of the crystal panels 14 and structural members 18. This is because the coefficients of expansion along different lattice planes varies within the lattice of the crystal itself. Accordingly, if the first and second interface surfaces 16 and 26 had orientations aligned along different lattice planes, the shield 10 could crack under high temperature processing operations.

The panels 14 and structural members 18 may come in a variety of sizes. For example, some of the bonded panels 14 and structural members 18 are cut shorter than the rest to define the generally rectangular shaped aperture 28, through which the silicon wafer 12 and automated material handling equipment (not shown) pass to be loaded onto the chuck 13.

Figure 4:
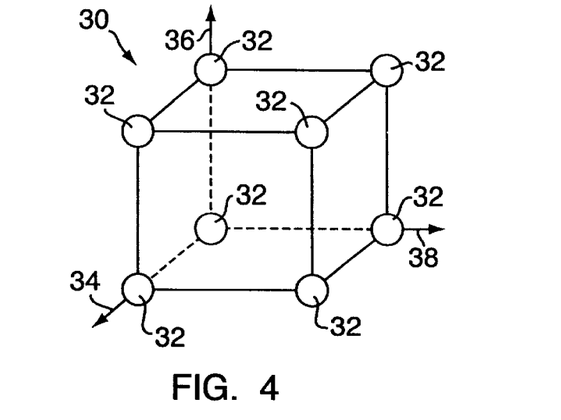
FIG. 4 is a schematic view of a cubic unit cell of a crystal lattice in accordance with the present invention.

Referring to FIG. 4, a representative unit cell of a simple cubic crystal lattice is shown generally at 30. The periodic arrangement of atoms 32 in a crystal is called its lattice. A crystal lattice always contains a volume which is representative of the entire lattice called the unit cell 30. The unit cell 30 is regularly repeated throughout the entire crystal lattice. For each unit cell 30, axes (or basis vectors) 34, 36 and 38 can be defined such that if the unit cell 30 is translated by integral multiples of these vectors 34, 36, and 38, a new unit cell identical to the original is found. The importance of the unit cell 30 is that the crystal as a whole can be studied by analyzing a representative volume. For example, distances of nearest atoms 32 can be calculated, as can the periodic properties of the crystal.

Figure 5:
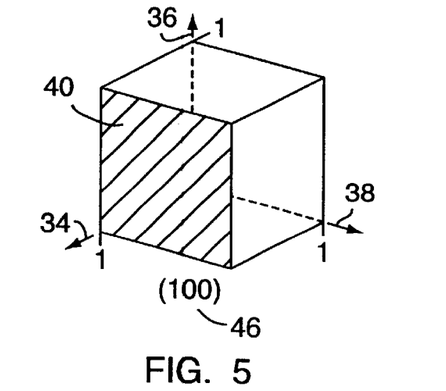
FIG. 5 is a schematic view of the cubic unit cell of FIG. 4 illustrating the (100) lattice plane.
Figure 6:
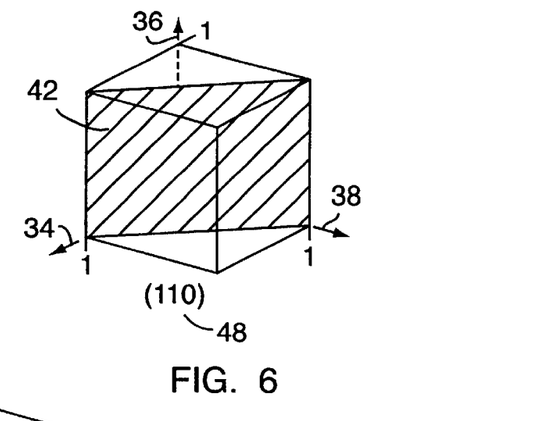
FIG. 6 is a schematic view of the cubic unit cell of FIG. 4 illustrating the (110) lattice plane.
Figure 7:
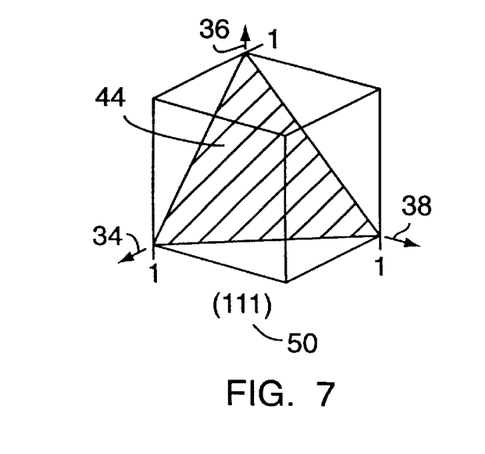
FIG. 7 is a schematic view of the cubic unit cell of FIG. 4 illustrating the (111) lattice plane.

Referring to FIGS. 5, 6 and 7, the arrangement of atoms 32 in the unit cells 30 also defines a set of lattice planes 40, 42 and 44 in the crystal. A set of Miller indices, 46, 48 and 50 defines the orientation of the lattice planes 40, 42 and 44, which can be calculated from the basis vectors 34, 36 and 38. For example, one such method in which the Miller indices can be derived is described in Chapter 1, page 2 of the text titled "Silicon Processing for the VLSI Era", Vol. 1, Second Edition, by authors Stanley Wolf and Richard Tauber, published by Lattice Press, copyright dated 2000, having ISBN number 0-9616721-6-1, which is herein incorporated by reference. The method described therein is as follows:

1. The intercepts of the planes with the crystal axes are found, and these intercepts are expressed as integral multiples of the basis vectors.
2. The reciprocal of the three integers found in step 1 are taken.
3. The smallest set of integers h, k, and l are found that have the same relationship to each other as the three reciprocals. These integers are the Miller indices of the plane, and the plane is labeled (h, k, 1). For example, if ¼, ⅓ and ½ are the three reciprocals, then 3, 4, and 6 are the three smallest integers, i.e., the Miller indices, whose relative values are the same as the relative values of the three reciprocals.

Figure 8:
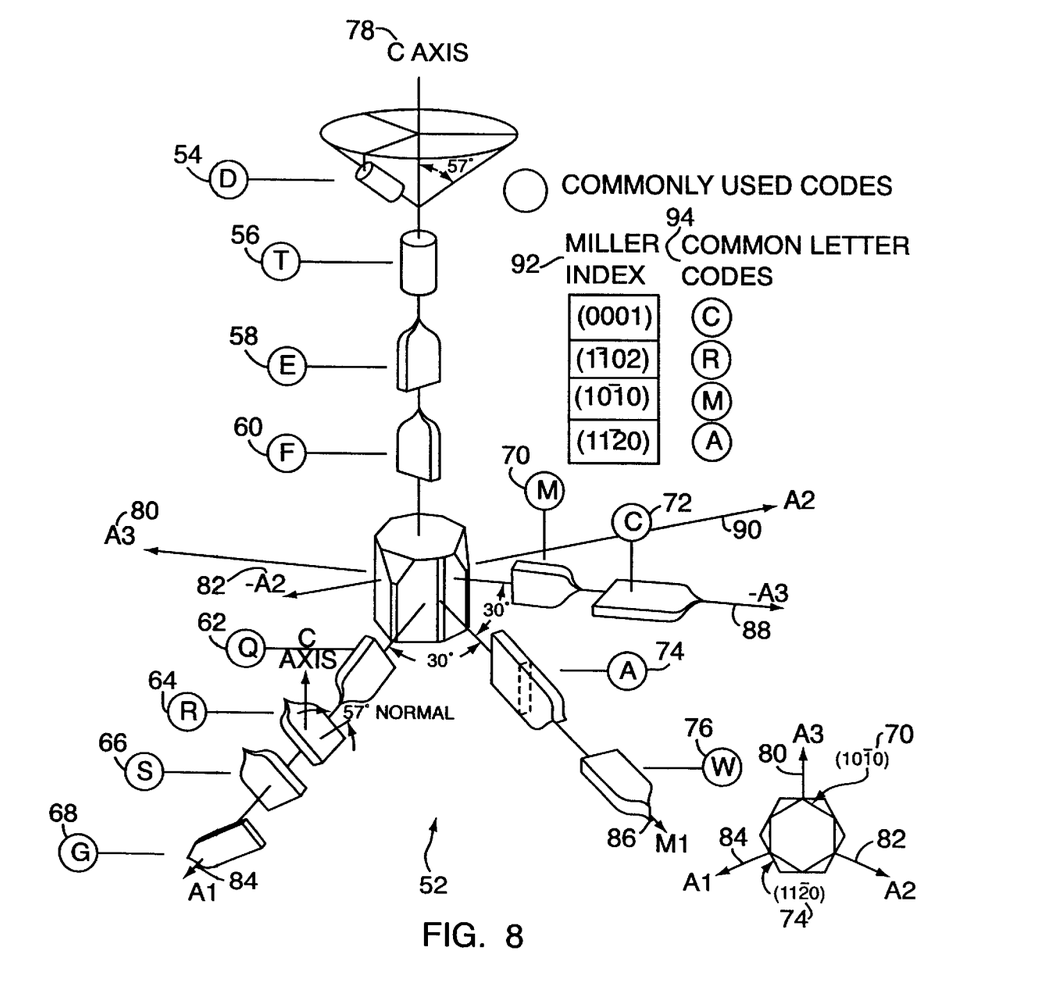
FIG. 8 is a perspective view of the triagonal hexagonal unit cell of a sapphire crystal lattice.

Referring to FIG. 8, a unit cell of sapphire is illustrated generally at 52. It is important to note that the simple cubic unit cell 30 has been used herein for illustrative purposes only, and its lattice planes only require Miller indices consisting of three integers to define their orientation. However, one skilled in the art would recognize that more complex unit cells exist. For example, the unit cell 52 for sapphire has a triagonal hexagon unit cell lattice, which require Miller indices of four integers, e.g., (0001), to define the lattice plane orientations. There are several lattice planes 54–76, and axes 78–90 associated with the sapphire unit cell 52. In addition to the Miller indices 92, common letter codes 94 are used to describe the orientation of the lattice planes 54–76 as well as the direction of the axes or basis vectors 78–90.

One of the important factors of lattice plans in general is that the coefficient of expansion of the crystal varies in a direction perpendicular to the orientation of these planes. Therefore, it is important that any interface surfaces of a sapphire structure composed of single sapphire crystal components have orientations that are aligned along the same lattice plan. That is, the Miller indices of both interface surfaces must be substantially identical to the Miller indices of one of the lattice planes of the sapphire unit cell or the structure could crack under high temperature operations.

Figure 9:
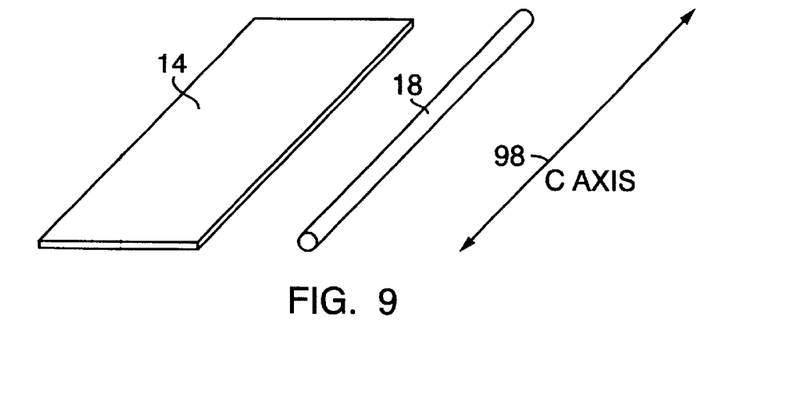
FIG. 9 is a perspective view of a panel and a structural member aligned along the C axis of a sapphire unit cell in accordance with the present invention.
Figure 10:
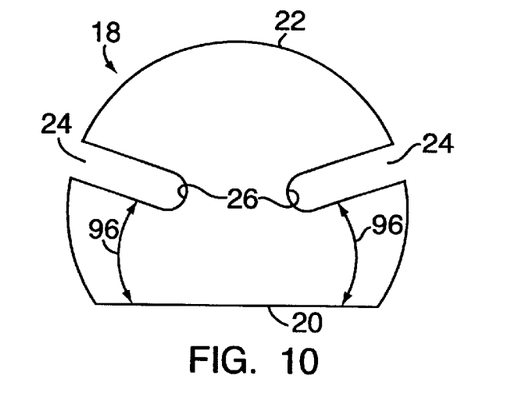
FIG. 10 is a cross sectional view of a structural member of FIG. 1.

Referring to FIG. 9 and 10, the sapphire shield 10 configuration emulates a cylindrical shape by integrating a number of flat panels 14 with a matching number of upright structural members 18 having similar crystal orientation. The structural members 18 will be machined so that axially aligned slots 26 will closely fit the edges of the flat panels 14. Each stanchion will have two slots 26, which will hold two adjacent flat panels 18 at a pre-determined angle 96 relative to the reference surface 20. This configuration allows for a wide range of structural shapes and sizes. For example other structures that may be constructed by this method would include domes, or spheres.

In this case the "C" axis 98 reflects the Miller Index of (0001), which is perpendicular to, and has the same Miller indices as, the "C" lattice plane. The important aspect of this is that the orientation must be matched so that joined components may thermally expand and contract in harmony.

Figure 11:
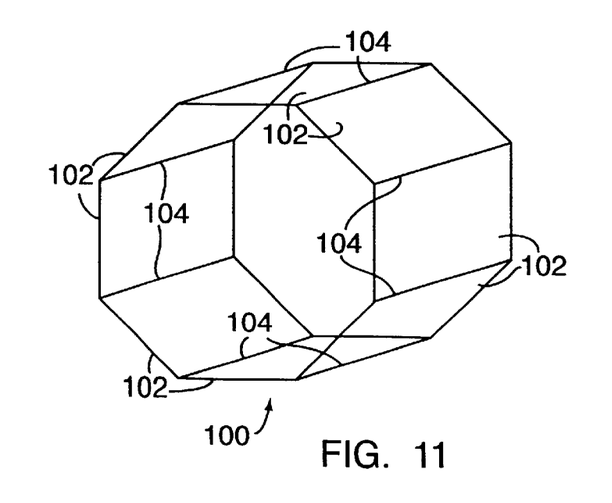
FIG. 11 is an alternative embodiment of a sapphire shield having exclusively panel components in accordance with the present invention.

Referring to FIG. 11, it will be clear to one skilled in the art that sapphire structures can also be assembled exclusively using panels 14 or structural members 18 so long as the interface surfaces of each component can be properly machined to provide support and aligned along like lattice planes. By way of example the sapphire shield 100 is constructed entirely of flat panels 102 which are aligned along like planes at respective interface surfaces 104.

Figure 12:
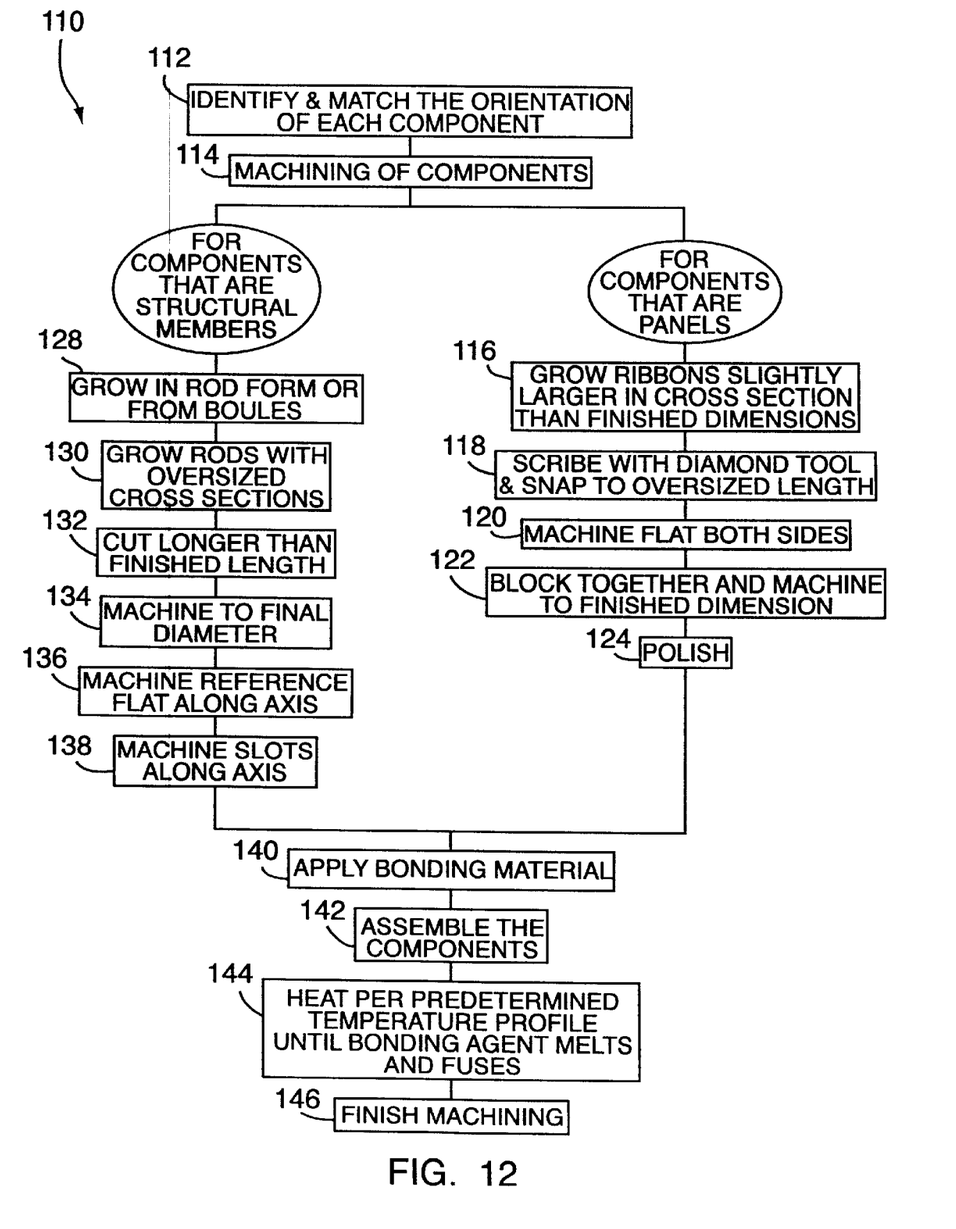
FIG. 12 is a flow diagram of a method of producing a sapphire structure in accordance with the present invention.

Referring to FIG. 12, a flow diagram of a method for producing the sapphire shields 10 and 100 and other sapphire structures in accordance with the present invention is shown generally at 110. Much of the sapphire is grown specifically regarding crystal orientation. However, regardless of the type of sapphire or its method of creation, consideration must be given to positively identify and match the orientation of each piece as indicated in step 112. This can be accomplished by a variety of methods including the use of cross-polarizing filters or Laue X-ray imaging. A detailed method of determining orientation utilizing a polariscope (cross polarization) is described hereinafter with reference to FIG. 13.

Once the orientations are identified, the individual components used to assemble the structures, e.g., panels or structural members, must be machined to size as shown in step 114. By way of example, the flat panels 14 and 102 are generally grown in ribbon form although it can be noted that these panels can be sliced from larger boules of sapphire. In either case, the crystal orientation must be maintained throughout the entire machining process.

The ribbon material is targeted to grow slightly larger in cross section than that of the final size of the panels 116 to allow for finish machining. These ribbons are scribed with a diamond tool and snapped to an oversized length 118. The oversized panel material is then machined flat on both sides 120 leaving only enough material to be polished at step 124. Once the panels are flat and consistent in thickness, they are blocked together with adhesive wax and machined as a group 122 to achieve width and length. The block components are then separated into individual panels for final polishing 124. Polishing can be achieved by a multi step single sided lapping process.

The structural members 18 are grown in rod form although it can be noted that these panels can be sliced from larger boules of sapphire 128. In either case, the crystal orientation must be maintained throughout the entire machining process. Like the panel material, the rod material is grown oversize in cross section to allow for final machining 130.

The rod is cut slightly longer than finish length 132 then machined to final diameter 134. The flat reference surface 20 (see FIG. 10) is machined along the lattice plane or axis to be used as a reference 136. The rods are then further machined to create two slots 24 also positioned along the diameter running axially along the rod in step 138. These will ultimately mate to adjoining flat panels while the relative angle between the slots will define the angle between the flat panels. The angle between the slots is also dependent on the number of panels being used to generate a segmented cylindrical shape.

After machining, the panel 14 and 102 and structural members 18 are then bonded together at step 140. The components are painted with a bonding agent at the areas which will be in contact with each other upon assembly. Specifically areas to be coated with bond agent would be the inner areas of the structural member grooves 26 and the mating interface edges 16 of the panels 14. A bonding compound typically used in this case is a yttrium-containing eutectic bonding compound as described in detail in U.S. Pat. No. 6,012,303, as discussed hereinbefore.

In step 142, the components are assembled upright with the panels 14 interlocked with the structural members 18 forming a segmented cylindrical shape. In step 144, the assembly is placed into a vacuum furnace and heated per a predetermined temperature profile until the bonding agent melts and fuses the panels 14 and structural members 18 together. The temperature ramp rates, soak times and soak temperatures will vary according to such factors as the shape of the product and the processes it will be subjected to. However, a typical heating and cooling profile would be as follows:

1. Ramp up at 300 degrees centigrade per hour to 1850 degrees;
2. Soak at 1850 degrees for 8 hours; and
3. Ramp down at 300 degrees centigrade per hour to room temperature.

In step 146, the segmented structure can be further finished machined as needed to adjust for application or fit. Access windows and ports may be added to accommodate functionality needs.

Figure 13:
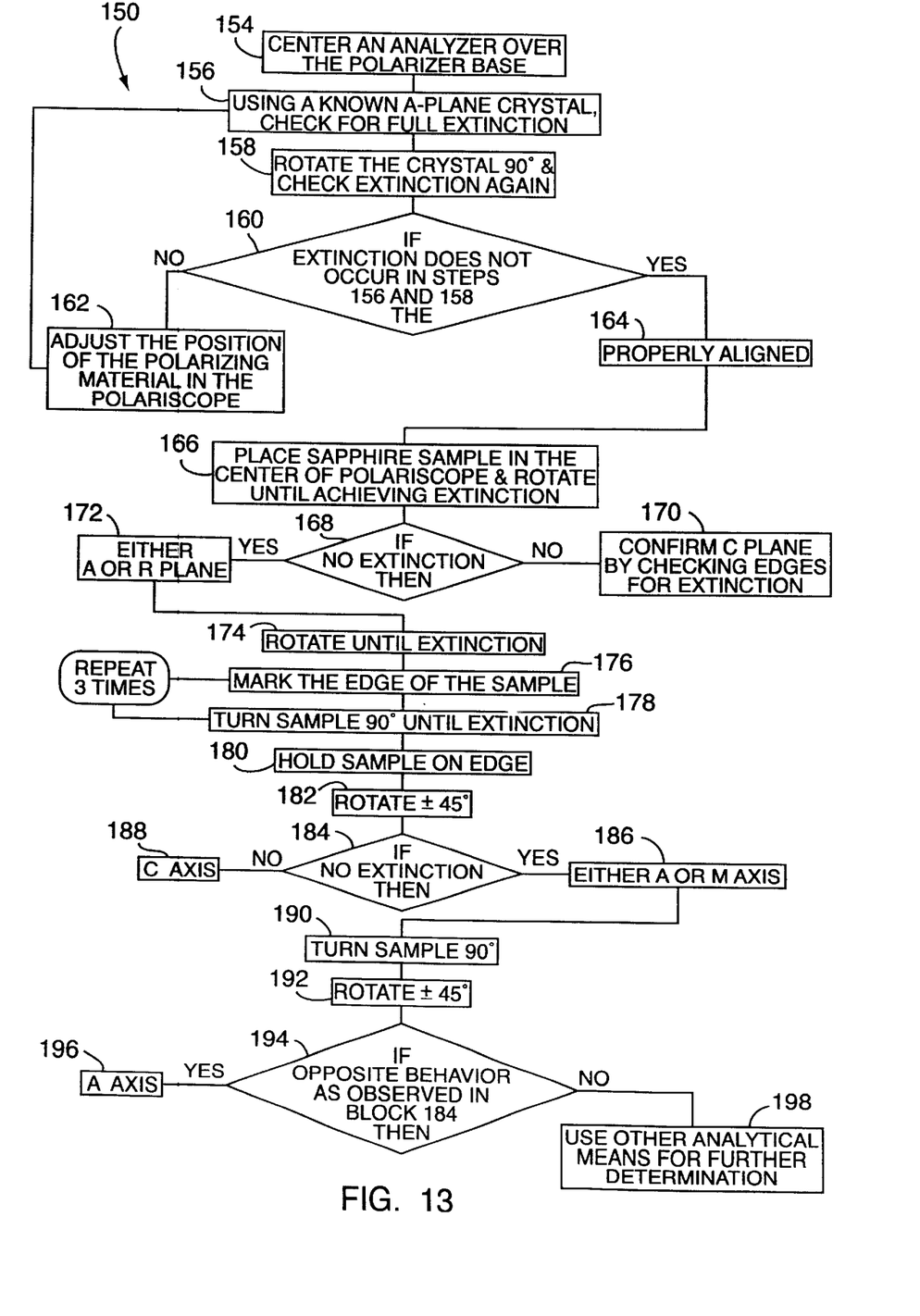
FIG. 13 is a flow diagram of a method of determining crystallographic orientation of an arbitrary piece of sapphire utilizing a polariscope in accordance with the present invention.

Referring to FIG. 13, a typical method of determining orientation, i.e., determining the principal crystallographic axes, in an arbitrary piece of sapphire utilizing a polariscope (cross polarization) is described generally at 150.

The following steps 154–164 check for proper alignment of the polariscope.

Step 154, center an analyzer over the base of the polariscope. This should be a condition of minimum transmission from the light source in the base (fully crossed polarizers), i.e., the point of maximum extinction.

In step 156, lay a piece of known A-plane crystal flat on the polarizer base and line up the growth direction along a diameter from the analyzer support post to the front of the polarizer (base). The crystal should be very close to fully extinct in this position.

Step 158, rotate the crystal 90° in either direction, with the A-plane still parallel to the plane of the polarizers. Extinction should occur again.

In step 160, if extinction does not occur in both cases (steps 156 and 158), then it is necessary to adjust the position(s) of the polarizing materials in the polariscope as indicated in step 162. From block 162 the method loops back to block 154 to start the procedure over again. If extinction does occur in steps 156 and 158, then the polariscope is properly aligned 164.

The following steps 166–198 check for orientation of an arbitrarily shaped piece of sapphire.

In step 166, place the sample flat, approximately centered (side-to-side), on the polariscope and rotate the sapphire slowly until it achieves approximately maximum darkness (extinction). Proceeding to block 168, if no extinction is observed at Step 166, then the sample is probably C-plane. Step 170 confirms this by having the operator check the edges for extinction behavior, that is both edges should exhibit extinction.

Step 172, if extinction is observed at step 166, the sample is A-plane or R-plane. Continuing to step 174, carefully rotate the sample back and forth over a few degrees until the maximum extinction is achieved. Mark the edge of the sample with a line aligned with the support post of the polariscope as indicated in step 176. Proceeding to block 178, turn the sample about 90° in either direction, where extinction will occur and remark the sample as in step 176. Repeat this procedure at 90° intervals around the circumference of the sample to obtain four approximately equally spaced marks.

Once marked, hold the sample on edge in the polariscope, with any one of the four marks uppermost, step 180. Proceeding to step 182, rotate the sample through 45° in both directions, i.e., a total of 90 degrees, about this vertical axis while observing the edge at the point of the upper mark. In step 184, if extinction is seen to occur, this vertical axis is either the A or M axis as illustrated in step 186. If no extinction occurs as in step 188, then the vertical axis is the C direction.

To determine if it's the A plane, proceed to step 190 and turn the sample, still on edge, 90° in either direction, and again rotate the sample plus and minus 45 degrees as in step 192. As shown in step 194, if the opposite behavior (as in step 184) should be observed than it is an A plane as shown in block 196. That is if the first axis showed extinction in step 184, then the second should show none, and vice versa. If however, the opposite behavior is not observed as in block 198, than further analysis is required beyond the use of the polariscope.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for making a single crystal structure, the method comprising:

growing a single crystal ribbon containing a plurality of lattice unit cells repeated substantially throughout, the unit cells having a periodic arrangement of atoms defining a set of lattice planes;

machining at least one single crystal panel from the ribbon;

selecting a plurality of single crystal components, including the at least one panel, having the lattice unit cell repeated substantially throughout the single crystal components;

determining the orientations of the lattice planes relative to each component;

machining each component along at least one of the set of lattice planes to define a pair of interface surfaces thereon;

applying bonding material to each interface surface;

assembling the components at their respective interface surfaces such that each pair of matching interface surfaces have an orientation substantially aligned along a common one of the set of lattice planes; and heating the components per a predetermined temperature profile until the bonding material melts and fuses the components together.

2. The method of claim 1 wherein the selecting comprises selecting a plurality of sapphire components.

3. The method of claim 1 wherein the components are none of panels and structural members.

4. The method of claim 3 comprising:

growing ribbons having a cross section slightly larger than finished dimensions of the panels;

cutting the ribbons to an oversized length relative to the finished dimensions of the panels;

machining both sides of the ribbons substantially flat;

blocking and machining the ribbons to substantially the finished dimensions; and polishing the ribbons to form the panels.

5. The method of claim 3 comprising:

growing rods with oversized cross sections relative to finished dimensions of the structural members;

cutting the rods longer than a finished length of the structural members;

machining the rods to a finished diameter;

machining a reference flat along a lattice plane of the rod; and machining a pair of slots along the same lattice plane as the reference flat, the slots having an angle relative to the reference flat and being sized to receive a portion of a panel therein.

6. The method of claim 1 wherein the applying material comprises applying a eutectic bonding material.

7. The method of claim 1 wherein the heating comprises:

ramping the temperature up at a first predetermined rate until a first threshold temperature is reached;

soaking at the first threshold temperature for a predetermined time period; and ramping the temperature down at a second predetermined rate until reaching a second threshold temperature.

8. The method of claim 7 wherein the predetermined threshold exceeds 1000 degrees centigrade.

9. The method of claim 7 wherein the first predetermined threshold exceeds 1800 degrees centigrade.

10. The method of claim 1 wherein determining the orientation of the lattice planes comprises using a polariscope.

11. The method of claim 10 wherein determining comprises:

aligning the polariscope with known parameters;

placing a component on the polariscope;

rotating the component until it achieves approximate maximum extinction;

determining the orientation of a lattice plane of the component based on the extinction behavior observed.

12. The method of claim 11 wherein determining comprises:

making the perimeter of the component in approximately 90 degree intervals, each mark being representative of a point where extinction was observed;

turn the component on a marked edge in the polariscope with any one of the four marks uppermost;

rotating the component approximately 45 degrees in both directions and observing the extinction behavior at the edges of the component; and determining the orientation of a lattice plane of the component based on the extinction behavior observed.

13. The method of claim 12 wherein determining comprises:

rotating the sample on the same marked edge approximately 90 degrees;

rotating the component approximately 45 degrees in both directions and observing the extinction behavior at the edges of the components; and determining the orientation of a lattice plane of the component based on the extinction behavior observed.

14. The method of claim 1 wherein determining the orientation of the lattice planes comprises using Laue X-ray imaging.

15. The method of claim 1 wherein forming a single crystal panel comprises:

machining a single crystal panel from the ribbon.

* * * * *